(12) United States Patent
Mackie et al.

(10) Patent No.: US 8,313,976 B2
(45) Date of Patent: Nov. 20, 2012

(54) METHOD AND APPARATUS FOR CONTROLLABLE SODIUM DELIVERY FOR THIN FILM PHOTOVOLTAIC MATERIALS

(76) Inventors: Neil M. Mackie, Fremont, CA (US); John Corson, Mountain View, CA (US)

( * ) Notice: Subject to any disclaimer, the term of this patent is extended or adjusted under 35 U.S.C. 154(b) by 0 days.

(21) Appl. No.: 13/228,872

(22) Filed: Sep. 9, 2011

(65) Prior Publication Data
US 2012/0003785 A1    Jan. 5, 2012

Related U.S. Application Data

(62) Division of application No. 12/385,572, filed on Apr. 13, 2009, now Pat. No. 8,134,069.

(51) Int. Cl.
*H01L 21/00* (2006.01)
(52) U.S. Cl. .................................. 438/84; 257/E31.008
(58) Field of Classification Search ............. 438/58, 438/84; 257/E31.008
See application file for complete search history.

(56) References Cited

U.S. PATENT DOCUMENTS

| | | |
|---|---|---|
| 2,890,419 A | 6/1959 | Hagan |
| 4,298,444 A | 11/1981 | Chahroudi |
| 4,318,938 A | 3/1982 | Barnett et al. |
| 4,356,073 A | 10/1982 | McKelvey |
| 4,415,427 A | 11/1983 | Hidler et al. |
| 4,465,575 A | 8/1984 | Love et al. |
| 4,818,357 A | 4/1989 | Case et al. |
| 5,141,564 A | 8/1992 | Chen et al. |
| 5,273,911 A | 12/1993 | Sasaki et al. |
| 5,306,646 A | 4/1994 | Lauf |
| 5,344,500 A | 9/1994 | Sasaki et al. |
| 5,415,927 A | 5/1995 | Hirayama et al. |
| 5,435,965 A | 7/1995 | Mashima et al. |
| 5,480,695 A | 1/1996 | Tenhover et al. |
| 5,522,535 A | 6/1996 | Ivanov et al. |
| 5,571,749 A | 11/1996 | Matsuda et al. |
| 5,578,503 A | 11/1996 | Karg et al. |
| 5,620,530 A | 4/1997 | Nakayama |
| 5,626,688 A | 5/1997 | Probst et al. |
| 5,744,252 A | 4/1998 | Rasky et al. |
| 5,814,195 A | 9/1998 | Lehan et al. |
| 5,824,566 A | 10/1998 | Sano et al. |
| 5,904,966 A | 5/1999 | Lippens |
| 5,986,204 A | 11/1999 | Iwasaki et al. |
| 6,020,556 A | 2/2000 | Inaba et al. |

(Continued)

FOREIGN PATENT DOCUMENTS

DE    2757301 A1    7/1979

(Continued)

OTHER PUBLICATIONS

U.S. Appl. No. 12/314,519, filed Dec. 11, 2008, Hollars et al.

(Continued)

*Primary Examiner* — Tony Tran

(57) ABSTRACT

A solar cell includes a substrate, a first electrode located over the substrate, where the first electrode comprises a first transition metal layer, at least one p-type semiconductor absorber layer located over the first electrode, an n-type semiconductor layer located over the p-type semiconductor absorber layer, and a second electrode located over the n-type semiconductor layer. The first transition metal layer contains (i) an alkali element or an alkali compound and (ii) a lattice distortion element or a lattice distortion compound. The p-type semiconductor absorber layer includes a copper indium selenide (CIS) based alloy material.

6 Claims, 9 Drawing Sheets

U.S. PATENT DOCUMENTS

| | | | |
|---|---|---|---|
| 6,107,564 | A | 8/2000 | Aguilera et al. |
| 6,300,556 | B1 | 10/2001 | Yamagishi et al. |
| 6,310,281 | B1 | 10/2001 | Wendt et al. |
| 6,365,010 | B1 | 4/2002 | Hollars |
| 6,372,538 | B1 | 4/2002 | Wendt et al. |
| 6,429,369 | B1 | 8/2002 | Tober et al. |
| 6,500,733 | B1 | 12/2002 | Stanbery |
| 6,525,264 | B2 | 2/2003 | Ouchida et al. |
| 6,559,372 | B2 | 5/2003 | Stanbery |
| 6,593,213 | B2 | 7/2003 | Stanbery |
| 6,690,041 | B2 | 2/2004 | Armstrong et al. |
| 6,736,986 | B2 | 5/2004 | Stanbery |
| 6,750,394 | B2 | 6/2004 | Yamamoto et al. |
| 6,787,692 | B2 | 9/2004 | Wada et al. |
| 6,797,874 | B2 | 9/2004 | Stanbery |
| 6,822,158 | B2 | 11/2004 | Ouchida et al. |
| 6,852,920 | B2 | 2/2005 | Sager et al. |
| 6,878,612 | B2 | 4/2005 | Nagao et al. |
| 6,881,647 | B2 | 4/2005 | Stanbery |
| 6,936,761 | B2 | 8/2005 | Pichler |
| 6,987,071 | B1 | 1/2006 | Bollman et al. |
| 7,045,205 | B1 | 5/2006 | Sager |
| 7,115,304 | B2 | 10/2006 | Roscheisen et al. |
| 7,122,392 | B2 | 10/2006 | Morse |
| 7,122,398 | B1 | 10/2006 | Pichler |
| 7,141,449 | B2 | 11/2006 | Shiozaki |
| 7,148,123 | B2 | 12/2006 | Stanbery |
| 7,163,608 | B2 | 1/2007 | Stanbery |
| 7,194,197 | B1 | 3/2007 | Wendt et al. |
| 7,196,262 | B2 | 3/2007 | Gronet |
| 7,227,066 | B2 | 6/2007 | Roscheisen et al. |
| 7,235,736 | B1 | 6/2007 | Buller et al. |
| 7,247,346 | B1 | 7/2007 | Sager et al. |
| 7,253,017 | B1 | 8/2007 | Roscheisen et al. |
| 7,259,322 | B2 | 8/2007 | Gronet |
| 7,262,392 | B1 | 8/2007 | Miller |
| 7,267,724 | B2 | 9/2007 | Tanaka et al. |
| 7,271,333 | B2 | 9/2007 | Fabick et al. |
| 7,291,782 | B2 | 11/2007 | Sager et al. |
| 7,306,823 | B2 | 12/2007 | Sager et al. |
| 7,319,190 | B2 | 1/2008 | Tuttle |
| 7,374,963 | B2 | 5/2008 | Basol |
| 7,544,884 | B2 | 6/2009 | Hollars |
| 2004/0144419 | A1 | 7/2004 | Fix et al. |
| 2005/0109392 | A1* | 5/2005 | Hollars .................. 136/265 |
| 2006/0096537 | A1 | 5/2006 | Tuttle |
| 2007/0062805 | A1 | 3/2007 | Mayer et al. |
| 2007/0074969 | A1 | 4/2007 | Simpson et al. |
| 2007/0269963 | A1 | 11/2007 | Cheng et al. |
| 2007/0283996 | A1 | 12/2007 | Hachtmann et al. |
| 2007/0283997 | A1 | 12/2007 | Hachtmann et al. |
| 2007/0289624 | A1 | 12/2007 | Kuriyagawa et al. |
| 2008/0000518 | A1 | 1/2008 | Basol |
| 2008/0053519 | A1 | 3/2008 | Pearce et al. |
| 2008/0142071 | A1 | 6/2008 | Dorn et al. |
| 2008/0193798 | A1 | 8/2008 | Lemon et al. |
| 2008/0271781 | A1 | 11/2008 | Kushiya et al. |
| 2008/0283389 | A1 | 11/2008 | Aoki |
| 2008/0308143 | A1* | 12/2008 | Atanackovic ............. 136/255 |
| 2008/0308147 | A1 | 12/2008 | Lu et al. |
| 2008/0314432 | A1 | 12/2008 | Paulson et al. |
| 2009/0014049 | A1 | 1/2009 | Gur et al. |
| 2009/0014057 | A1 | 1/2009 | Croft et al. |
| 2009/0014058 | A1 | 1/2009 | Croft et al. |
| 2009/0145746 | A1 | 6/2009 | Hollars |
| 2009/0223556 | A1 | 9/2009 | Niesen et al. |
| 2010/0116341 | A1 | 5/2010 | Huang et al. |
| 2011/0005587 | A1 | 1/2011 | Auvray et al. |

FOREIGN PATENT DOCUMENTS

| | | |
|---|---|---|
| FR | 2820241 A1 | 8/2002 |
| JP | 11-274534 A | 10/1999 |
| JP | 11-298016 A | 10/1999 |
| WO | 02/065554 A1 | 8/2002 |

OTHER PUBLICATIONS

U.S. Appl. No. 12/379,427, filed Feb. 20, 2009, Schmidt, Chris.
U.S. Appl. No. 12/379,428, Feb. 20, 2009, Schmidt, Chris.
U.S. Appl. No. 12/385,570, filed Apr. 13, 2009, Mackie et al.
U.S. Appl. No. 12/385,571, filed Apr. 13, 2009, Juliano et al.
Bodegård et al., "The influence of sodium on the grain structure of $CuInSo_2$ films for photovoltaic applications," 12th European Photovoltaic Solar Energy Conference, Proceedings of the International Conference, Amsterdam, The Netherlands, Apr. 11-15, 1994, Hill et al. Ed., vol. II, 1743-1746.
Contreras et al., "On the role of Na and modifications to $Cu(In,Ga)Se_2$ absorber materials using thin-MF (M=Na, K, Cs) precursor layers," $26^{th}$ IEEE PVSC, Anaheim, California, Sep. 30-Oct. 3, 1997, 359-362.
Devaney et al., "Recent improvement in $CuInSe_2/ZnCdS$ thin film solar cell efficiency," 18th IEEE Photovoltaic Spec. Conf., 1985, New York, 1733-1734.
Evbuomwan et al., "Concurrent materials and manufacturing process selection in design function deployment," Concurrent Engineering: Research and Applications, Jun. 1995, 3(2):135-144.
Granath et al., "Mechanical issues of NO back contracts for $Cu(In,Ga)Se_2$ devices," 13th European Photovoltaic Solar Energy Conference, Proceedings of the International Conference, Nice, France, Oct. 23-27, 1995, Freiesleben et al. Ed., vol. II, 1983-1986.
Hedström et al., "$ZnO/CdS/Cu(In,Ga)Se_2$ thin film solar cells with improved performance," $23^{rd}$ IEEE Photovoltaic Specialists Conference, Louisville, Kentucky, May 10-14, 1993, 364-371.
Holz et al., "The effect of substrate impurities on the electronic conductivity in CIS thin films," $12^{th}$ European Photovoltaic Solar Energy Conference, Proceedings of the International Conference, Amsterdam, The Netherlands, Apr. 11-15, 1994, Hill et al. Ed., vol. II, 1592-1595.
Mickelsen et al., "High photocurrent polycrystalline thin-film CdS/$CuInSe_2$ solar cell," Appl. Phys. Lett., Mar. 1, 1980, 36(5):371-373.
Mohamed et al., "Correlation between structure, stress and optical properties in direct current sputtered molybdenum oxide films," Thin Solid Films, 2003, 429:135-143.
Probst et al., "The impact of controlled sodium incorporated on rapid thermal processed $Cu(InGa)Se_2$-thin films and devices," First WCPEC, Hawaii, Dec. 5-9, 2004, 144-147.
Ramanath et al., "Properties of 19.2% Efficiency $ZnO/CdS/CuInGaSe_2$ Thin-film Solar Cells," Progress in Photovoltaics: Research and Applications, 2003, 11:225-230.
Rau et al., "$Cu(In,Ga)Se_2$ solar cells," Clean Electricity From Photovoltaics, Series on Photoconversion of Solar Energy, vol. 1, 2001, Archer et al. Ed., Chapter 7, 277-345.
Rudmann et al., "Effects of NaF coevaporation on structural properties of $Cu(In,Ga)Se_2$ thin films," Thin Solid Films, 2003, 431-432:37-40.
Sakurai et al,. "Properties of Cu(In,Ga)Se2:Fe Thin Films for Solar Cells," Mater. Res. Soc. Symp. Proc., 2005, 865:F14.12.1-F.14.12.5.
Scofield et al., "Sodium diffusion, selenization, and microstructural effects associated with various molybdenum back contact layers for Cis-based solar cells," Proc. of the $24^{th}$ IEEE Photovoltaic Specialists Conference, New York, 1995, 164-167.
So et al., "Properties of Reactively Sputtered $Mo_{1-x}O_x$ Films," Appl. Phys. A, 1988, 45:265-270.
Stolt et al., "$ZnO/CdS/CuInSe_2$ thin-film solar cells with improved performance," Appl. Phys. Lett., Feb. 8, 1993, 62(6):597-599.
Windischmann, Henry, "Intrinsic Stress in Sputter-Deposited Thin Films," Critical Reviews in Solid State and Materials Science, 1992, 17(6):547-596.
Yun et al., "Fabrication of CIGS solar cells with a Na-doped Mo layer on a Na-free substrate," Thin Solid Films, 2007, 515:5876-5879.
International Search Report and Written Opinion, Intl. Application PCT/US2010/030456. International Search Authority: Korean Intellectual Property Office (ISA/KR), Nov. 17, 2010.
Ullal, et al. "Current Status of Polycrystalline Thin-Film PV Technologies"; National Renewable Energy Laboratory; U.S. Department of Energy; Sep. 1997.
Minami, T. "New n-Type Transparent Conducting Oxides"; MRS Bulletin; Aug. 2000.
Manaila, et al. "Structure of nitride film hard coatings prepared by reactive magnetron sputtering"; Applied Surface Science; vol. 134; Apr. 1998.

Topic, et al. "Band-gap engineering in CdS/Cu (In,Ga)Se2 solar cells"; Journal of Applied Physics; vol. 79, No. 11; Jun. 1998.

Lundberg, et al. "The effect of Ga-grading in CIGS thin film solar cells"; Elsevier; Thin Solid Films 480-481; 2005.

Dullweber, et al. "Back surface band gap gradings in Cu(In,Ga)Se2 solar cells"; Elsevier; Thin Solid Films 387; 2001.

International Preliminary Report on Patentability issued in PCT Application PCT/US2010/030456, mailed on Oct. 27, 2011.

* cited by examiner

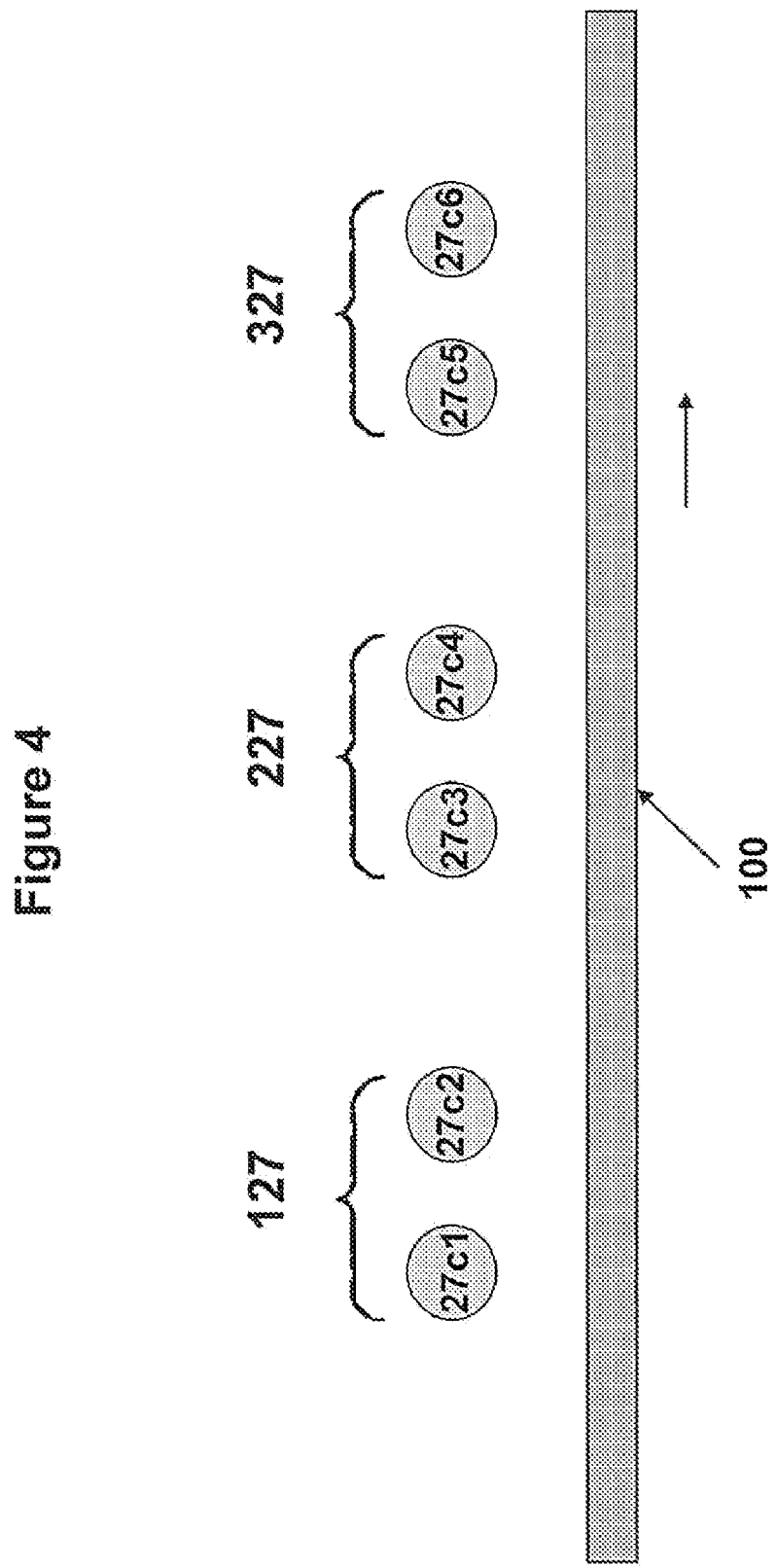

US 8,313,976 B2

METHOD AND APPARATUS FOR CONTROLLABLE SODIUM DELIVERY FOR THIN FILM PHOTOVOLTAIC MATERIALS

The present application is a divisional of U.S. application Ser. No. 12/385,572, filed Apr. 13, 2009, which is incorporated herein by reference in its entirety.

FIELD OF THE INVENTION

The present invention relates generally to the field of photovoltaic devices, and more specifically to thin-film solar cells comprising an alkali-containing transition metal electrode.

BACKGROUND OF THE INVENTION

Copper indium diselenide ($CuInSe_2$, or CIS) and its higher band gap variants copper indium gallium diselenide ($Cu(In,Ga)Se_2$, or CIGS), copper indium aluminum diselenide ($Cu(In,Al)Se_2$), copper indium gallium aluminum diselenide ($Cu(In,Ga,Al)Se_2$) and any of these compounds with sulfur replacing some of the selenium represent a group of materials, referred to as copper indium selenide CIS based alloys, have desirable properties for use as the absorber layer in thin-film solar cells. To function as a solar absorber layer, these materials should be p-type semiconductors. This may be accomplished by establishing a slight deficiency in copper, while maintaining a chalcopyrite crystalline structure. In CIGS, gallium usually replaces 20% to 30% of the normal indium content to raise the band gap; however, there are significant and useful variations outside of this range. If gallium is replaced by aluminum, smaller amounts of aluminum are used to achieve the same band gap.

SUMMARY OF THE INVENTION

One embodiment of this invention provides a solar cell comprising a substrate, a first electrode located over the substrate, where the first electrode comprises a first transition metal layer, at least one p-type semiconductor absorber layer located over the first electrode, an n-type semiconductor layer located over the p-type semiconductor absorber layer, and a second electrode located over the n-type semiconductor layer. The first transition metal layer contains (i) an alkali element or an alkali compound and (ii) a lattice distortion element or a lattice distortion compound. The p-type semiconductor absorber layer includes a copper indium selenide (CIS) based alloy material.

Another embodiment of the invention provides a solar cell comprising a substrate, a first electrode located over the substrate, at least one p-type semiconductor absorber layer located over the first electrode, an n-type semiconductor layer located over the p-type semiconductor absorber layer, and a second electrode located over the n-type semiconductor layer. The first electrode comprises a first transition metal layer containing an alkali element or an alkali compound, and further comprises (i) an alkali diffusion barrier layer located between the substrate and the first transition metal layer, and (ii) a second transition metal layer located between the first transition metal layer and the p-type semiconductor absorber layer, where the second transition metal layer has a higher porosity than the alkali diffusion barrier layer and the second transition metal layer permits alkali diffusion from the first transition metal layer into the p-type semiconductor absorber layer. The p-type semiconductor absorber layer includes a copper indium selenide (CIS) based alloy material.

Another embodiment of the invention provides a method of manufacturing a solar cell comprising providing a substrate, depositing a first electrode over the substrate wherein the first electrode comprises a first transition metal layer comprising: (i) an alkali element or an alkali compound, and (ii) a lattice distortion element or a lattice distortion compound, depositing at least one p-type semiconductor absorber layer over the first electrode, wherein the p-type semiconductor absorber layer includes a copper indium selenide (CIS) based alloy material, depositing an n-type semiconductor layer over the p-type semiconductor absorber layer, and depositing a second electrode over the n-type semiconductor layer.

BRIEF DESCRIPTION OF THE DRAWINGS

FIG. 4 illustrates schematically the use of three sets of dual magnetrons to increase the deposition rate and grade the composition of the CIS layer to vary its band gap.

DESCRIPTION OF THE PREFERRED EMBODIMENTS

As grown CIS based films are intrinsically p-type doped. However, it was found that a small amount of sodium dopants in CIS based films increases the p-type conductivity of the CIGS film and the open circuit voltage, and in turn, improves the efficiency of the solar cell. For example, Ramanathan (Ramanathan et al., Prog. Photovolt. Res. Appl. 11 (2003) 225, incorporated herein by reference in its entirety) teaches that a solar cell, having an efficiency as high as 19.5%, may be obtained by using a soda-lime glass substrate in combination with depositing a CIS film under a high growth temperature. This method significantly improves the efficiency of a traditional solar cell by diffusing sodium from the glass substrate into the CIS film. However, it is difficult to control the amount of the sodium provided to the CIS film and the speed of the sodium diffusion from a glass substrate. Furthermore, unlike glass substrates, other substrates, such as metal and plastic substrates, do not provide such a readily available supply of sodium.

One embodiment of this invention provides a solar cell comprising a substrate, a first electrode located over the substrate, where the first electrode comprises a first transition metal layer containing an alkali element or compound, at least one p-type semiconductor absorber layer located over the first electrode, an n-type semiconductor layer located over the p-type semiconductor absorber layer, and a second electrode located over the n-type semiconductor layer.

Figure 1:
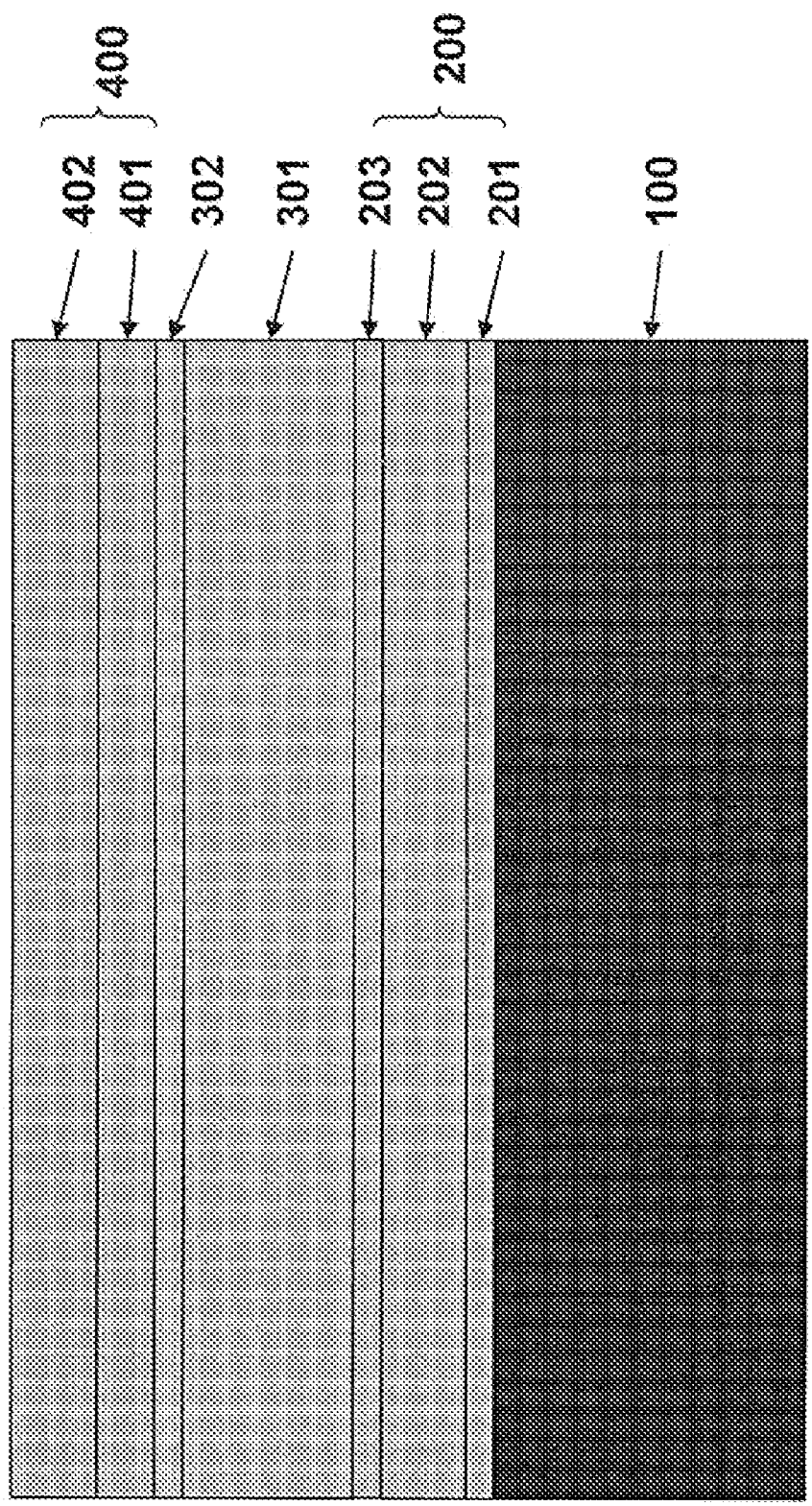
FIG. 1 is a schematic side cross-sectional view of a CIS based solar cell according to one embodiment of the invention.

As illustrated in FIG. 1, one embodiment of the invention provides a solar cell contains a substrate 100 and a first (lower) electrode 200. The first electrode 200 comprises a first transition metal layer 202 that contains (i) an alkali element or an alkali compound and (ii) a lattice distortion element or a lattice distortion compound. Alternatively, the first transition metal layer 202 contains an alkali element or an alkali compound but is substantially free of the lattice distortion element or compound.

The transition metal of the first transition metal layer 202 may be any suitable transition metal, for example but not limited to Mo, W, Ta, V, Ti, Nb, and Zr. The alkali element or alkali compound may comprise one or more of Li, Na, and K. The lattice distortion element or the lattice distortion compound may be any suitable element or compound, for example, oxygen, nitrogen, sulfur, selenium, an oxide, a nitride, a sulfide, a selenide, an organometallic compound (e.g. a metallocene or a metal carbonyl such as tungsten pentacyonyl or tungsten hexacarbonyl, and the like), or a combination thereof. For example, in a non-limiting example, the first transition metal layer 202 may comprise at least 59 atomic percent molybdenum, 5 to 40 atomic percent oxygen, such as around 10 to 20 atomic percent oxygen, and 0.01 to 1.5 atomic percent sodium, such as 0.01 to 0.4 atomic percent sodium. In some embodiments, the first transition metal layer 202 may comprise $10^{20}$ to $10^{23}$ atoms/cm$^3$ sodium.

The first transition metal layer 202 may have a thickness of 100 to 500 nm, for example 200 to 400 nm such as around 300 nm. In some embodiments, the first transition metal layer 202 may comprise multiple sub-layers, for example 1 to 20 sub-layers such as 1 to 10 sub-layers. Each sub-layer may have a different sodium concentration, resulting in a graded sodium concentration profile within the first transition metal layer 202.

In some embodiments, the lattice distortion element or the lattice distortion compound has a crystal structure different from that of the first transition metal layer to distort a polycrystalline lattice of the first transition metal layer 202. In some embodiments, when the transition metal is molybdenum, the lattice distortion element may be oxygen, forming the first transition metal layer 202 of body centered cubic Mo lattice distorted by face centered cubic oxide compositions, such as $MoO_2$ and $MoO_3$ (e.g., $MoO_x$ type lattice distortion compounds). Without wishing to be bounded by a particular theory, the density of the first transition metal layer 202 may be reduced due to a greater interplanar spacing as a result of the lattice distortion. This enhances alkali intercalation (e.g., diffusion) from layer 202 into the CIS based absorber layer 301. In some other embodiments, the lattice distortion element may exist as substitutional or interstitial atoms, rather than forming a compound with other impurities or the matrix of the first transition metal layer 202.

Optionally, the first electrode 200 of the solar cell may comprise an alkali diffusion barrier layer 201 located between the substrate 100 and the first transition metal layer 202, and/or a second transition metal layer 203 located over the first transition metal layer 202. Additional barrier and/or adhesion layers (not shown), such as Cr and/or metal nitride layers may be further disposed between the electrode 200 and the substrate 100, for example between the optional alkali diffusion barrier layer 201 and the substrate 100.

The optional alkali diffusion barrier layer 201 and second transition metal layer 203 may comprise any suitable materials. For example, they may be independently selected from a group consisting Mo, W, Ta, V, Ti, Nb, Zr, Cr, TiN, ZrN, TaN, VN, $V_2N$ or combinations thereof. Layers 201, 202 and 203 may comprise the same or different metals from each other.

In some embodiments, while the alkali diffusion barrier layer 201 is substantially oxygen free, the first transition metal layer 202 and/or the second transition metal layer 203 may contain oxygen and/or be deposited at a higher pressure than the alkali diffusion barrier layer 201 to achieve a lower density than the alkali diffusion barrier layer 201. For example, layer 203 may contain 1 to 10 atomic percent oxygen, such as 1 to 5 atomic percent oxygen, and 90 to 95 percent molybdenum. Of course, other impurity elements (e.g. lattice distortion elements or the lattice distortion compounds described above), instead of or in addition to oxygen, may be contained in the first transition metal layer 202 and/or the second transition metal layer 203 to reduce the density thereof. For example, sodium may diffuse from layer 202 into layer 203. Thus, layers 202 and 203 are preferably denser than layer 201 if all three layers are molybdenum based layers. Layer 203 controls the alkali diffusion into the absorber layer 301 based on layer 203 thickness, composition and/or density. Layer 203 also acts a nucleation layer for the absorber layer 301.

The alkali diffusion barrier layer 201 may be in compressive stress and have a thickness greater than that of the second transition metal layer 203. For example, the alkali diffusion barrier layer 201 may have a thickness of around 100 to 400 nm such as 100 to 200 nm, while the second transition metal layer 203 has a thickness of around 50 to 200 nm such as 50 to 100 nm.

The higher density and greater thickness of the alkali diffusion barrier layer 201 substantially reduces or prevents alkali diffusion from the first transition metal layer 202 into the substrate 100. On the other hand, the second transition metal layer 203 has a higher porosity than the alkali diffusion barrier layer 201 and permits alkali diffusion from the first transition metal layer 202 into the p-type semiconductor absorber layer 301. In these embodiments, alkali may diffuse from the first transition metal layer 202, through the lower density second transition metal layer 203, into the at least one p-type semiconductor absorber layer 301 during and/or after the step of depositing the at least one p-type semiconductor absorber layer 301.

Alternatively, the optional alkali diffusion barrier layer 201 and/or optional second transition metal layer 203 may be omitted. When the optional second transition metal layer 203 is omitted, the at least one p-type semiconductor absorber layer 301 is deposited on the first transition metal layer 202, and alkali may diffuse from the first transition metal layer 202 into the at least one p-type semiconductor absorber layer 301 during or after the deposition of the at least one p-type semiconductor absorber layer 301.

In preferred embodiments, the p-type semiconductor absorber layer 301 may comprise a CIS based alloy material selected from copper indium selenide, copper indium gallium selenide, copper indium aluminum selenide, or combinations thereof. Layer 301 may have a stoichiometric composition having a Group I to Group III to Group VI atomic ratio of about 1:1:2, or a non-stoichiometric composition having an atomic ratio of other than about 1:1:2. Preferably, layer 301 is slightly copper deficient and has a slightly less than one copper atom for each one of Group III atom and each two of Group VI atoms. The step of depositing the at least one p-type semiconductor absorber layer may comprise reactively AC sputtering the semiconductor absorber layer from at least two electrically conductive targets in a sputtering atmosphere that comprises argon gas and a selenium containing gas (e.g. selenium vapor or hydrogen selenide). For example, each of the at least two electrically conductive targets comprises copper, indium and gallium; and the CIS based alloy material comprises copper indium gallium diselenide. In one embodiment, the p-type semiconductor absorber layer 301 may comprise 0.005 to 1.5 atomic percent sodium, such as 0.005 to 0.4 atomic percent sodium diffused from the first transition metal layer 202. As described above, sodium impurities may diffuse from the first transition metal layer 202 to the CIS based alloy layer 301. In one embodiment, the sodium impurities may concentrate at the grain boundaries of CIS based alloy, and may have a concentration as high as $10^{19}$ to $10^{22}$ atoms/cm$^3$.

An n-type semiconductor layer 302 may then be deposited over the p-type semiconductor absorber layer 301. The n-type semiconductor layer 302 may comprise any suitable n-type semiconductor materials, for example, but not limited to ZnS, ZnSe or CdS.

A second electrode 400, also referred to as a transparent top electrode, is further deposited over the n-type semiconductor layer 302. The transparent top electrode 400 may comprise multiple transparent conductive layers, for example, but not limited to, one or more of an Indium Tin Oxide (ITO), Zinc Oxide (ZnO) or Aluminum Zinc Oxide (AZO) layers 402 located over an optional resistive Aluminum Zinc Oxide (RAZO) layer 401. Of course, the transparent top electrode 400 may comprise any other suitable materials, for example, doped ZnO or SnO.

Optionally, one or more antireflection (AR) films (not shown) may be deposited over the transparent top electrode 400, to optimize the light absorption in the cell, and/or current collection grid lines may be deposited over the top conducting oxide.

Alternatively, the solar cell may be formed in reverse order. In this configuration, a transparent electrode is deposited over a substrate, followed by depositing an n-type semiconductor layer over the transparent electrode, depositing at least one p-type semiconductor absorber layer over the n-type semiconductor layer, depositing a first transition metal layer over the at least one p-type semiconductor absorber layer, and optionally depositing a second transition metal layer between the first transition metal layer and the p-type semiconductor absorber layer and/or depositing a alkali diffusion barrier layer over the first transition metal layer. The substrate may be a transparent substrate (e.g., glass) or opaque (e.g., metal). If the substrate used is opaque, then the initial substrate may be delaminated after the steps of depositing the stack of the above described layers, and then bonding a glass or other transparent substrate to the transparent electrode of the stack.

A solar cell described above may be fabricated by any suitable methods. In one embodiments, a method of manufacturing such a solar cell comprises providing a substrate 100, depositing a first electrode 200 over the substrate 100, depositing at least one p-type semiconductor absorber layer 301 over the first electrode 200, depositing an n-type semiconductor layer 302 over the p-type semiconductor absorber layer 301, and depositing a second electrode 400 over the n-type semiconductor layer 302. The step of depositing the first electrode 200 comprises depositing the first transition metal layer 202. While sputtering was described as the preferred method for depositing all layers onto the substrate, some layers may be deposited by MBE, CVD, evaporation, plating, etc. In some embodiments, one or more sputtering steps may be reactive sputtering.

In some embodiments, the lattice distortion element or compound may be contained in at least one sputtering target used for sputtering the first transition metal layer 202. For example, in some embodiments the step of sputtering the first transition metal layer 202 comprises sputtering from a target comprising a combination of the transition metal, the alkali element or compound, and the lattice distortion element or compound, for example, a DC magnetron sodium molybdate target or a composite molybdenum and sodium molybdate target. The composite target may contain 1 to 10 weight percent oxygen, 0.5 to 5 weight percent sodium and balance molybdenum.

In some other embodiments, the step of sputtering the first transition metal layer 202 comprises sputtering from at least one pair of sputtering targets having different compositions from each other. The at least one pair of sputtering targets are selected from: (i) a first molybdenum target and a second sodium molybdate or sodium oxide target; (ii) a first molybdenum oxide target and a second sodium selenide, sodium fluoride, sodium selenide or sodium sulfate target; or (iii) a first molybdenum target and a second sodium target in an oxygen containing reactive sputtering system. Preferably, the at least one pair of targets is located in the same vacuum chamber of a magnetron sputtering system.

Alternatively, reactive sputtering may be used to introduce some or all of the lattice distortion element or compound, such as oxygen, nitrogen, etc., from a gas phase instead of or in addition to from a sputtering target. A target comprising both transition metal and alkali element or compound and optionally the lattice distortion element or compound may be used in the reactive sputtering (e.g., additional oxygen may be provided to layer 202 via reactive sputtering in addition to the oxygen provided from a composite molybdenum and sodium molybdate target). Alternatively, a pair of target comprising one transition metal target (e.g. a Mo target) and one alkali element or compound containing target (e.g. a NaF target) may be used in the reactive sputtering. In one embodiment, the transition metal target may be substantially free of alkali. As used herein, the term "substantially free of alkali" means that no alkali metal or other alkali-containing material is intentionally alloyed or doped, but unavoidable impurities of alkali may present. If desired, more than two targets may be used to sputter the first transition metal layer 202.

Figure 2:
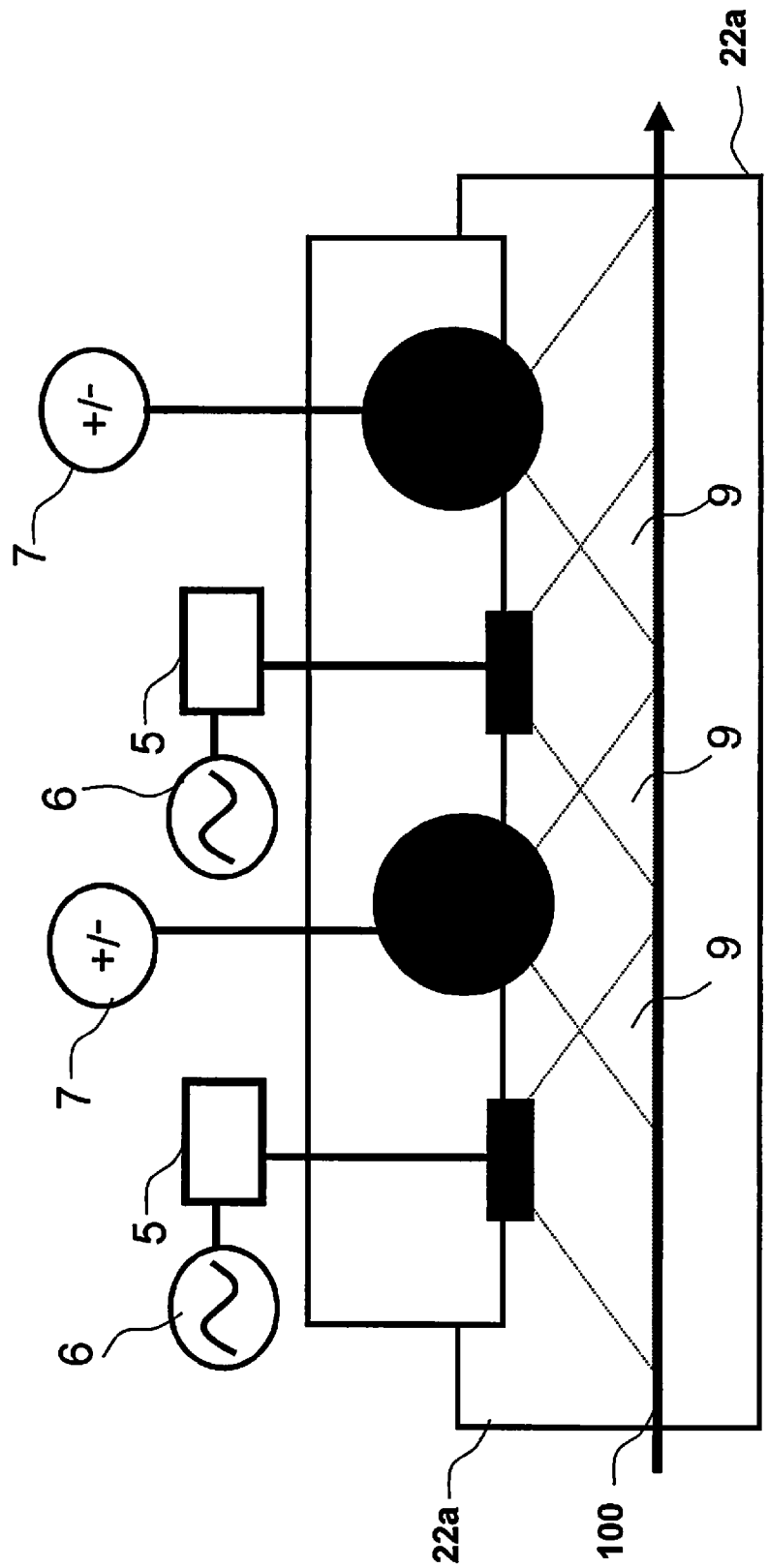
FIG. 2 shows a highly simplified schematic diagram of a top view of a sputtering apparatus that can be used to forming a first transition metal layer, such as an alkali-containing transition metal layer, for example, a sodium-containing molybdenum film.

For example, by using a sputtering apparatus illustrated in FIG. 2, the first transition metal layer (not shown in FIG. 2, and referred to as layer 202 in FIG. 1) may be deposited over a substrate 100. Targets comprising an alkali-containing material (e.g., targets 37a and 37b) and targets comprising a transition metal (e.g., 27a and 27b) are located in a sputtering process module 22a, such as a vacuum chamber. In this non-limiting example, the transition metal targets 27a and 27b are rotating Mo cylinders and are powered by DC power sources 7, and the alkali-containing targets 37a and 37b are planar NaF targets and are powered by RF generators 6 through matching networks 5. The target types alternate and end with a transition metal target, for example target 27b as shown in FIG. 2. The distance between the adjacent targets is small enough such that a sufficient overlap 9 may exist between the alternating transition and metal alkali containing fluxes and thus enhance the intermixing of the transition metal and the alkali-containing material during depositing the alkali-containing transition metal layer.

In some embodiments, the step of depositing the first transition metal layer 202 may be conducted in an oxygen and/or nitrogen rich environment, and may comprise DC sputtering the transition metal from the first target and pulsed DC sputtering, AC sputtering, or RF sputtering the alkali compound from the second target. Any suitable variations of the sputtering methods may be used. For example, for electrically insulating second target materials, AC sputtering refers to any variation of AC sputtering methods that may be used to for insulating target sputtering, such as medium frequency AC sputtering or AC pairs sputtering. In one embodiment, the step of depositing the first transition metal layer may comprise DC sputtering a first target comprising a transition metal, such as molybdenum, and pulsed DC sputtering, AC sputtering, or RF sputtering a second target comprising alkali-containing material, such as a sodium-containing material, in an oxygen rich sputtering environment.

The substrate 100 may be a foil web, for example, a metal web substrate, a polymer web substrate, or a polymer coated metal web substrate, and may be continuously passing through the sputtering module 22a during the sputtering process, following the direction of the imaginary arrow along the web 100. Any suitable materials may be used for the foil web. For example, metal (e.g., stainless steel, aluminum, or titanium) or thermally stable polymers (e.g., polyimide or the like) may be used. The foil web 100 may move at a constant or variable rate to enhance intermixing.

In the various embodiment described above, the sodium-containing material may comprise any material containing sodium, for example alloys or compounds of sodium with one or more of selenium, sulfur, oxygen, nitrogen or barrier metal (such as molybdenum, tungsten, tantalum, vanadium, titanium, niobium or zirconium), such as sodium fluoride, sodium molybdate, sodium fluoride, sodium selenide, sodium hydroxide, sodium oxide, sodium sulfate, sodium tungstate, sodium selenate, sodium selenite, sodium sulfide, sodium sulfite, sodium titanate, sodium metavanadate, sodium orthovanadate, or combinations thereof. Alloys or compounds of lithium and/or potassium may be also used, for example but not limited to alloys or compounds of lithium or potassium with one or more of selenium, sulfur, oxygen, nitrogen, molybdenum, tungsten, tantalum, vanadium, titanium, niobium or zirconium. The transition metal target may comprise a pure metal target, a metal alloy target, a metal oxide target (such as a molybdenum oxide target), etc.

In one embodiment, the transition metal is molybdenum, and the first transition metal layer 202 comprises molybdenum intentionally doped with oxygen and at least one alkali element, such as sodium. The oxygen can be omitted or replaced with any lattice distortion elements or compounds. Likewise, sodium may be replaced in whole or in part by lithium or potassium. The first transition layer 202 may contain elements other than molybdenum, oxygen and sodium, such as other materials that are diffused into this layer during deposition, such as indium, copper, selenium and/or barrier layer metals.

The amount of sodium diffused into the at least one p-type semiconductor absorber layer 301 may be tuned by independently controlling the thickness of deposited molybdenum sublayers and the thickness of sodium-containing sublayers in the first transition layer, by independently tuning the sputtering rate of the first target comprising molybdenum and the sputtering rate of the second target comprising sodium. A variable sodium content as a function of thickness in the sodium-containing molybdenum layer may also be generated by independently controlling the thickness of the deposited molybdenum sublayers and the thickness of the sodium-containing sublayers in the first transition metal layer 202. The molybdenum sublayers and the sodium-containing sublayers may become intermixed, forming a continuous sodium-containing molybdenum layer, during at least one of the steps of depositing the first transition metal layer 202, depositing the at least one p-type semiconductor absorber layer 301, or an optional post-deposition annealing process.

Optionally, the step of depositing the first electrode 200 further comprises depositing an alkali diffusion bather layer 201 between the substrate 100 and the first transition metal layer 202, and depositing a second transition metal layer 203 over the first transition metal layer 202. In some embodiments, the step of sputtering the alkali diffusion barrier layer 201 occurs at a lower pressure than the step of sputtering the second transition metal layer 203.

In some embodiments, the step of sputtering the alkali diffusion barrier layer 201 occurs under a first sputtering environment in a first vacuum chamber of a magnetron sputtering system, while the step of sputtering the first and/or second transition metal layers 202, 203 occurs under a second sputtering environment in a second vacuum chamber of the magnetron sputtering system different from the first vacuum chamber. The second sputtering environment differs from the first sputtering environment in at least one of argon pressure, oxygen pressure, or nitrogen pressure. For example, the step of sputtering the alkali diffusion barrier layer 201 may occur from a transition metal target in a substantially oxygen free atmosphere, while the step of sputtering the first and/or second transition metal layers 202, 203 occurs in an oxygen containing atmosphere.

For example, in some embodiments, the step of depositing the alkali diffusion barrier layer 201 may comprise sputtering from a metal target under 0.8 to 1.2 mTorr pressure such as around 1 mTorr or less in an inert environment, while the step of depositing the first and/or second transition metal layers 202, 203 comprises sputtering from a transition metal target(s) under 2 to 8 mTorr pressure in an oxygen and/or nitrogen rich environment. The sputtering power used for depositing the alkali diffusion barrier layer 201 and depositing the second transition metal layer 203 may also be different. For example, the sputtering power used for depositing the alkali diffusion bather layer 201 may be higher or lower than that used for depositing the second transition metal layer 203.

Preferably, layer 202 is sputtered from at least one alkali containing target while layer 203 is sputtered from one or more targets that are substantially alkali free. For example, layer 203 may be reactively sputtered from one or more molybdenum targets in an oxygen containing ambient.

The step of sputtering the first transition metal layer 202 may occur in the same or different vacuum chamber from that of layer 203. For example, a first transition metal layer 202 containing lattice distortion element/compound(s) may be deposited in the second vacuum chamber in which the second transition metal layer 203 is deposited. Alternatively, the step of sputtering the first transition metal layer 202 may occur in a third vacuum chamber of the magnetron sputtering system different from the first and the second vacuum chambers.

In some embodiments, the step of depositing the first electrode 200 (comprising depositing the alkali diffusion barrier layer 201, depositing the first transition metal layer 202 and depositing the second transition metal layer 203) comprises sputtering the alkali diffusion barrier layer 201, sputtering the first transition metal layer 202, and sputtering the second transition metal layer 203 in the same sputtering apparatus.

More preferably, the steps of depositing the first electrode 200, depositing the at least one p-type semiconductor absorber layer 301, depositing the n-type semiconductor layer 302, and depositing the second electrode 400 comprise sputtering the alkali diffusion barrier layer 201, the first transition metal layer 202, the second transition metal layer 203, the p-type absorber layer 301, the n-type semiconductor layer 302 and one or more conductive films of the second electrode 400 over the substrate 100 (preferably a web substrate in this embodiment) in corresponding process modules of a plurality of independently isolated, connected process modules without breaking vacuum, while passing the web substrate 100 from an input module to an output module through the plurality of independently isolated, connected process modules such that the web substrate continuously extends from the input module to the output module while passing through the plurality of the independently isolated, connected process modules. Each of the process modules may include one or more sputtering targets for sputtering material over the web substrate 100.

Figure 3:
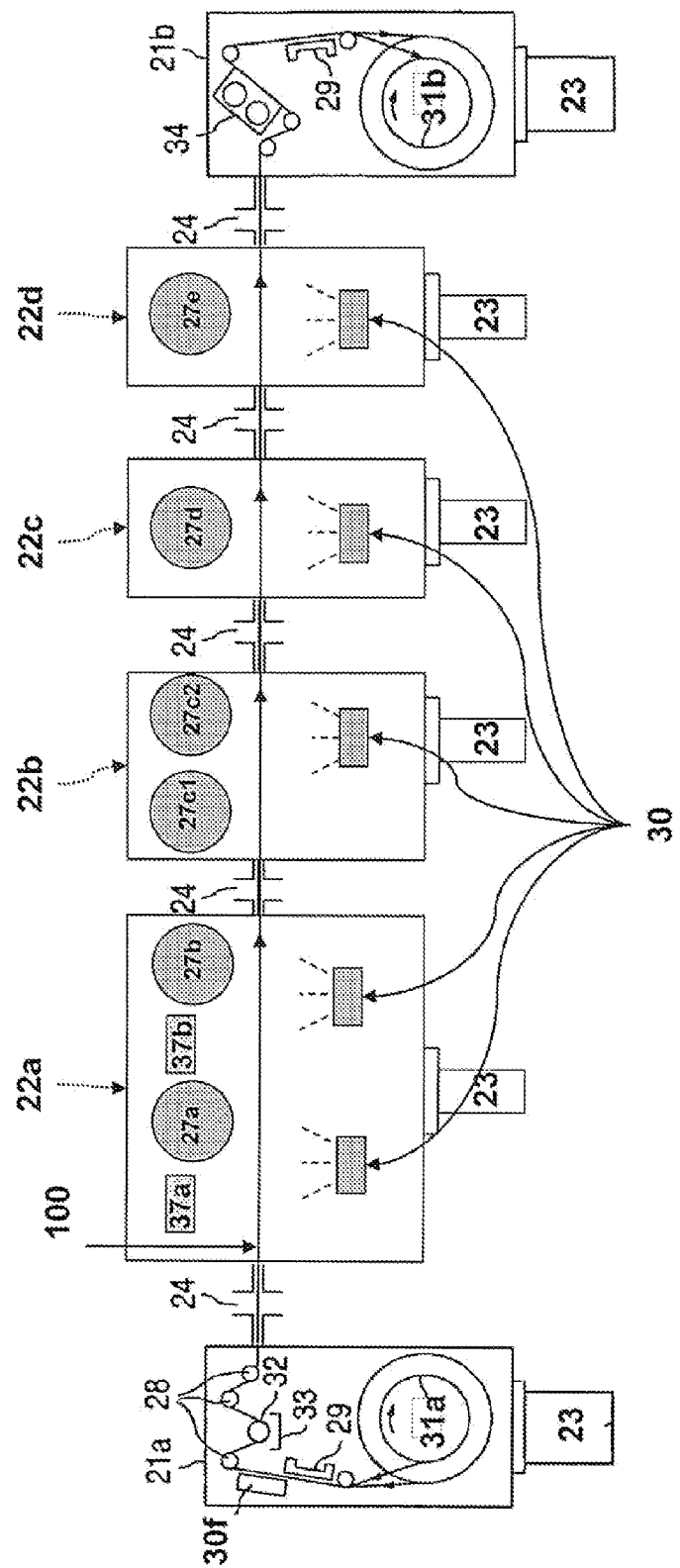
FIG. 3 shows a highly simplified schematic diagram of a top view of a modular sputtering apparatus that can be used to manufacture the solar cell depicted in FIG. 1.

For example, a modular sputtering apparatus for making the solar cell, as illustrated in FIG. 3 (top view), may be used for depositing the layers. The apparatus is equipped with an input, or load, module 21a and a symmetrical output, or unload, module 21b. Between the input and output modules are process modules 22a, 22b, 22c and 22d. The number of process modules 22 may be varied to match the requirements of the device that is being produced. Each module has a pumping device 23, such as vacuum pump, for example a high throughput turbomolecular pump, to provide the required vacuum and to handle the flow of process gases during the sputtering operation. Each module may have a number of pumps placed at other locations selected to provide optimum pumping of process gases. The modules are connected together at slit valves 24, which contain very narrow low conductance isolation slots to prevent process gases from mixing between modules. These slots may be separately pumped if required to increase the isolation even further. Other module connectors 24 may also be used. Alternatively, a single large chamber may be internally segregated to effectively provide the module regions, if desired. U.S. Published Application No. 2005/0109392 A1 ("Hollars"), filed on Oct. 25, 2004, discloses a vacuum sputtering apparatus having connected modules, and is incorporated herein by reference in its entirety.

The web substrate 100 is moved throughout the machine by rollers 28, or other devices. Additional guide rollers may be used. Rollers shown in FIG. 3 are schematic and non-limiting examples. Some rollers may be bowed to spread the web, some may move to provide web steering, some may provide web tension feedback to servo controllers, and others may be mere idlers to run the web in desired positions. The input spool 31a and optional output spool 31b thus are actively driven and controlled by feedback signals to keep the web in constant tension throughout the machine. In addition, the input and output modules may each contain a web splicing region or device 29 where the web 100 can be cut and spliced to a leader or trailer section to facilitate loading and unloading of the roll. In some embodiments, the web 100, instead of being rolled up onto output spool 31b, may be sliced into solar modules by the web splicing device 29 in the output module 21b. In these embodiments, the output spool 31b may be omitted. As a non-limiting example, some of the devices/steps may be omitted or replaced by any other suitable devices/steps. For example, bowed rollers and/or steering rollers may be omitted in some embodiments.

Heater arrays 30 are placed in locations where necessary to provide web heating depending upon process requirements. These heaters 30 may be a matrix of high temperature quartz lamps laid out across the width of the web. Infrared sensors provide a feedback signal to servo the lamp power and provide uniform heating across the web. In one embodiment, as shown in FIG. 3, the heaters are placed on one side of the web 100, and sputtering targets 27a-e and 37a-b are placed on the other side of the web 100. Sputtering targets 27 and 37 may be mounted on dual cylindrical rotary magnetron(s), or planar magnetron(s) sputtering sources, or RF sputtering sources.

After being pre-cleaned, the web substrate 100 may first pass by heater array 30f in module 21a, which provides at least enough heat to remove surface adsorbed water. Subsequently, the web can pass over roller 32, which can be a special roller configured as a cylindrical rotary magnetron. This allows the surface of electrically conducting (metallic) webs to be continuously cleaned by DC, AC, or RF sputtering as it passes around the roller/magnetron. The sputtered web material is caught on shield 33, which is periodically changed. Preferably, another roller/magnetron may be added (not shown) to clean the back surface of the web 100. Direct sputter cleaning of a web 100 will cause the same electrical bias to be present on the web throughout the machine, which, depending on the particular process involved, might be undesirable in other sections of the machine. The biasing can be avoided by sputter cleaning with linear ion guns instead of magnetrons, or the cleaning could be accomplished in a separate smaller machine prior to loading into this large roll coater. Also, a corona glow discharge treatment could be performed at this position without introducing an electrical bias.

Next, the web 100 passes into the process module 22a through valve 24. Following the direction of the imaginary arrows along the web 100, the full stack of layers may be deposited in one continuous process. The first transition metal layer 202 may be sputtered in the process module 22a over the web 100, as illustrated in FIG. 3 (and previously in FIG. 1). Optionally, the process module 22a may include more than two pairs of targets, each pair of targets comprising a transition metal target 27 and an alkali-containing target 37, arranged in such a way that the types of targets alternate and the series of targets end with a transition metal target. The alkali-containing target has a composition different from that of the transition metal target. Alternatively, only a single target 27 may be used or a plurality of targets 27 having the same composition (e.g., composite molybdenum and sodium molybdate) may be used.

The web 100 then passes into the next process module, 22b, for deposition of the at least one p-type semiconductor absorber layer 301. In a preferred embodiment shown in FIG. 3, the step of depositing the at least one p-type semiconductor absorber layer 301 includes reactively alternating current (AC) magnetron sputtering the semiconductor absorber layer from at least one pair of two conductive targets 27c1 and 27c2, in a sputtering atmosphere that comprises argon gas and a selenium-containing gas. In some embodiment, the pair of two conductive targets 27c1 and 27c2 comprise the same targets. For example, each of the at least two conductive targets 27c1 and 27c2 comprises copper, indium and gallium, or comprises copper, indium and aluminum. The selenium-containing gas may be hydrogen selenide or selenium vapor. In other embodiments, targets 27c1 and 27c2 may comprise different materials from each other. The radiation heaters 30 maintain the web at the required process temperature, for example, around 400-800° C., for example around 500-700° C., which is preferable for the CIS based alloy deposition.

In some embodiments, at least one p-type semiconductor absorber layer 301 may comprise graded CIS based material. In this embodiment, the process module 22b further comprises at least two more pairs of targets (227, and 327), as illustrated in FIG. 4. The first magnetron pair 127 (27c1 and 27c2) are used to sputter a layer of copper indium diselenide while the next two pairs 227, 327 of magnetrons targets (27c3, 27c4 and 27c5, 27c6) sputter deposit layers with increasing amounts of gallium (or aluminum), thus increasing and grading the band gap. The total number of targets pairs may be varied, for example may be 2-10 pairs, such as 3-5 pairs. This will grade the band gap from about 1 eV at the bottom to about 1.3 eV near the top of the layer. Details of depositing the graded CIS material is described in the Hollars published application, which is incorporated herein by reference in its entirety.

Optionally, the alkali diffusion barrier layer 201 may be sputtered over the substrate 100 in a process module added between the process modules 21a and 22a. The second transition metal layer 203 may be sputtered over the first transition metal layer 202 in a process module added between the process modules 22a and 22b. Further, one or more process modules (not shown) may be added to deposit additional barrier layers and/or adhesion layer to the stack, if desired.

In some embodiments, one or more process modules (not shown) may be further added between the process modules 21a and 22a to sputter a back side protective layer over the back side of the substrate 100 before the first electrode 200 is deposited on the front side of the substrate. U.S. application Ser. No. 12/379,428 titled "Protective Layer for Large-Scale Production of Thin-Film Solar Cells" and filed on Feb. 20, 2009, which is hereby incorporated by reference, describes such deposition process.

The web 100 may then pass into the process modules 22c and 22d, for depositing the n-type semiconductor layer 302, and the transparent top electrode 400, respectively. Any suitable type of sputtering sources may be used, for example, rotating AC magnetrons, RF magnetrons, or planar magnetrons. Extra magnetron stations (not shown), or extra process modules (not shown) could be added for sputtering the optional one or more AR layers.

Finally, the web 100 passes into output module 21b, where it is either wound onto the take up spool 31b, or sliced into solar cells using cutting apparatus 29.

NON-LIMITING WORKING EXAMPLES

Example I

Figure 5A:
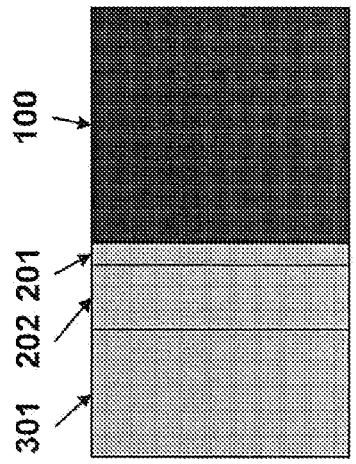
FIG. 5a shows a schematic side cross-sectional view of Example I.

A non-limiting working example having a structure illustrated in FIG. 5a is obtained by the following steps. First, a molybdenum barrier layer 201 is deposited over a substrate. Second, a first transition meal layer 202 is deposited over the molybdenum barrier layer 201 by sputtering from a composite molybdenum and sodium molybdate target. Finally, a CIGS layer 301 is deposited over the first transition metal layer 202, resulting a structure as shown in FIG. 5a.

Figure 5B:
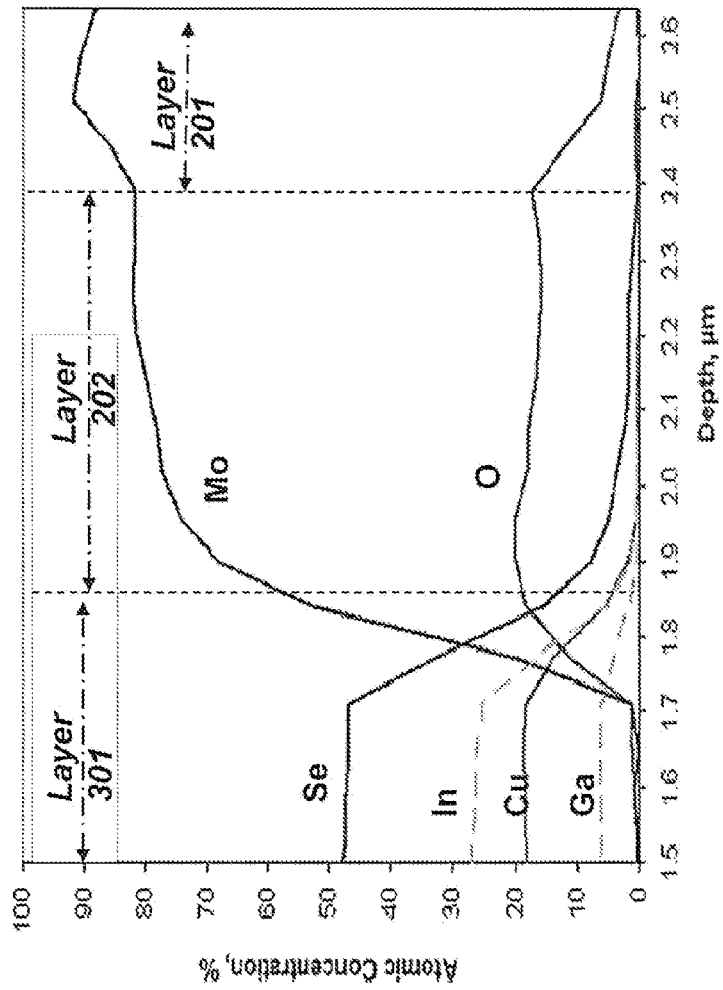
FIG. 5b shows Auger Electron Spectroscopy (AES) spectra of Cu, In, Ga, Se, O, and Mo in the films of Example I.

FIG. 5b shows AES depth profiles of Cu, In, Ga, Se, O and Mo through the film stack. The interface of the CIGS layer 301 and the first transition metal layer 202 (a sodium-oxygen-containing molybdenum layer) can be clearly determined by the Cu/In/Ga/Se and Mo spectra. Similarly, the interface of the first transition metal layer 202 and the Mo layer 201 can be clearly determined by the AES spectra of oxygen. The first transition layer 202 of this non-limiting example comprises around 20 atomic percent oxygen and has a thickness of around 500 nm (from the depth of 1.9 micron to 2.4 micron), as shown in FIG. 5b. Of course, the first transition layer 202 may have different compositions and/or thickness by varying sputtering target(s) and/or sputtering parameters.

Example II

Figure 6A:
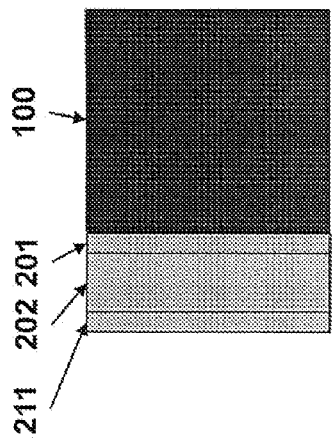
FIG. 6a shows a schematic side cross-sectional view of Example II.

A non-limiting working example as shown in FIG. 6a is obtained by the following steps. First, a molybdenum barrier layer 201 is deposited over a substrate 100 by DC sputtering from a molybdenum target under a low pressure of around 0.5-1.5 mTorr. Second, a first transition meal layer 202 is deposited over the molybdenum barrier layer 201 by DC sputtering from an array of composite molybdenum and sodium molybdate targets under a moderate sputtering pressure of around 3-6 mTorr. Finally, another molybdenum layer 211 is deposited over the first transition metal layer 202, resulting a structure as shown in FIG. 6a. Thus, in this non-limiting example, the first transition metal layer 202 is a molybdenum layer intentionally doped with sodium and oxygen, while the molybdenum layers 201 and 211 are not.

Figure 6B:
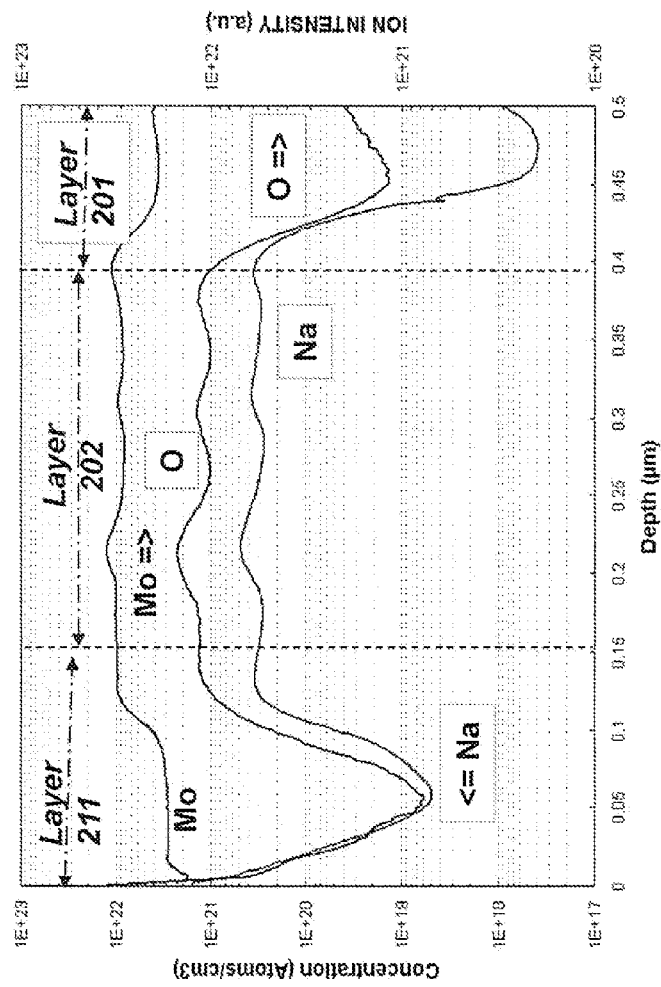
FIG. 6b shows SIMS spectra of Na, O, and Mo in the films of Example II.

As shown in FIG. 6b, the SIMS depth profiles indicate that, within the first transition metal layer 202, the sodium concentration profile positively correlates with the oxygen concentration profile. Without wishing to be bounded to a particular theory, it is believed that a greater amount of sodium impurities can be incorporated when the degree of lattice distortion due to molybdenum oxide is higher.

The barrier layers 201 and 211 contain substantially less sodium as the denser molybdenum of layers 201 and 211 acts as effective sodium diffusion barriers.

Example III

Figure 7A:
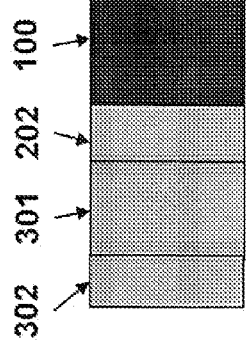
FIG. 7a shows a schematic side cross-sectional view of Example III.

In this non-limiting working example, Samples a through c having structures illustrated in FIG. 7a are obtained by sputter depositing a first transition meal layer 202 over a steel web substrate 100, followed by depositing a CIGS layer 301 over the first transition meal layer 202 and depositing a CdS layer 302 over the CIGS layer 301. The first transition meal layers 202 of Samples a through c are deposited by sputtering from three a composite molybdenum and sodium molybdate targets at a sputtering power of 6 kW, 9.5 kW, and 13 kW, respectively.

Figure 7B:
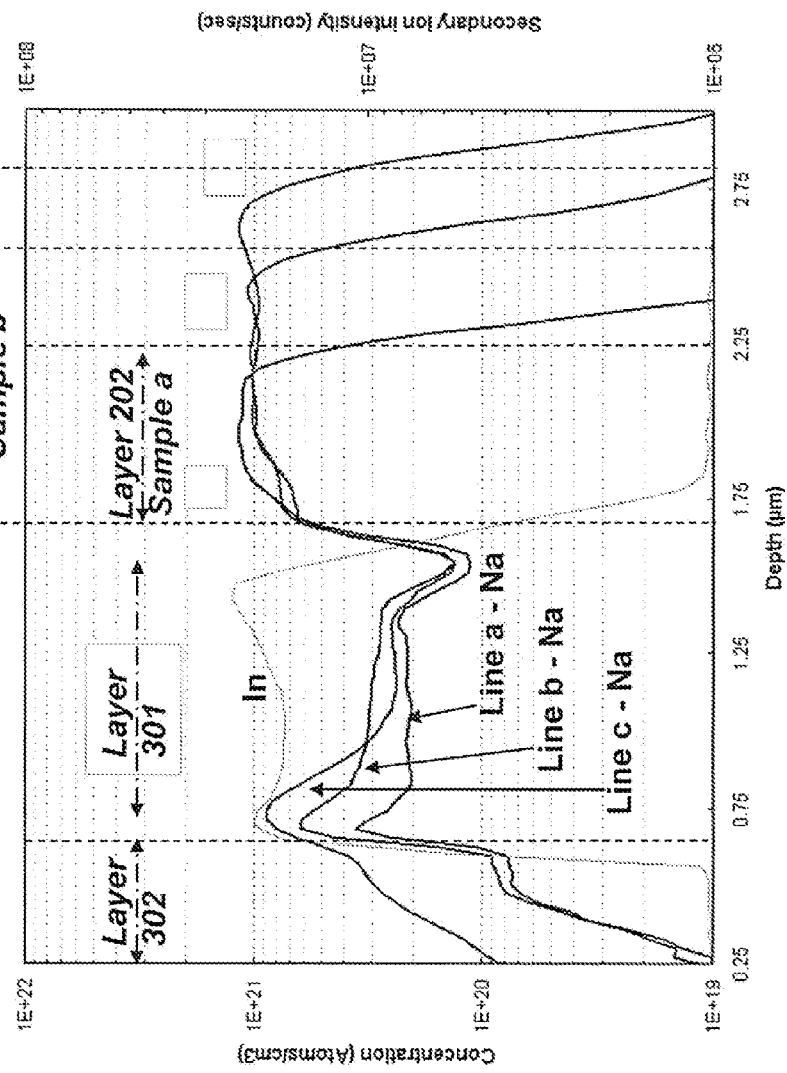
FIG. 7b shows SIMS spectra of In and Na in the films of Example III. Lines a through c refer to SIMS spectra of sodium in Samples A through C, respectively.

The SIMS depth profiles through the film stacks of Samples a through c, as shown in FIG. 7b, indicate that the resulting sodium concentration in CIGS layer of Sample C (with a peak concentration of around $9 \times 10^{20}$ atoms/cm$^3$) is greater than that of Sample B and in turn greater than that of Sample A (with a peak concentration of around $3 \times 10^{20}$ atoms/cm$^3$). This indicates that increasing the thickness of the first transition metal layer 202 may enhance the sodium diffusion from the first transition metal layer 202.

Example IV

This working example compares the efficiency of solar cell A containing a sodium doped CIGS layer 301, as a non-limiting example of this invention, with that of a conventional solar cell B containing a CIGS layer 301 substantially free of sodium.

Figure 8:
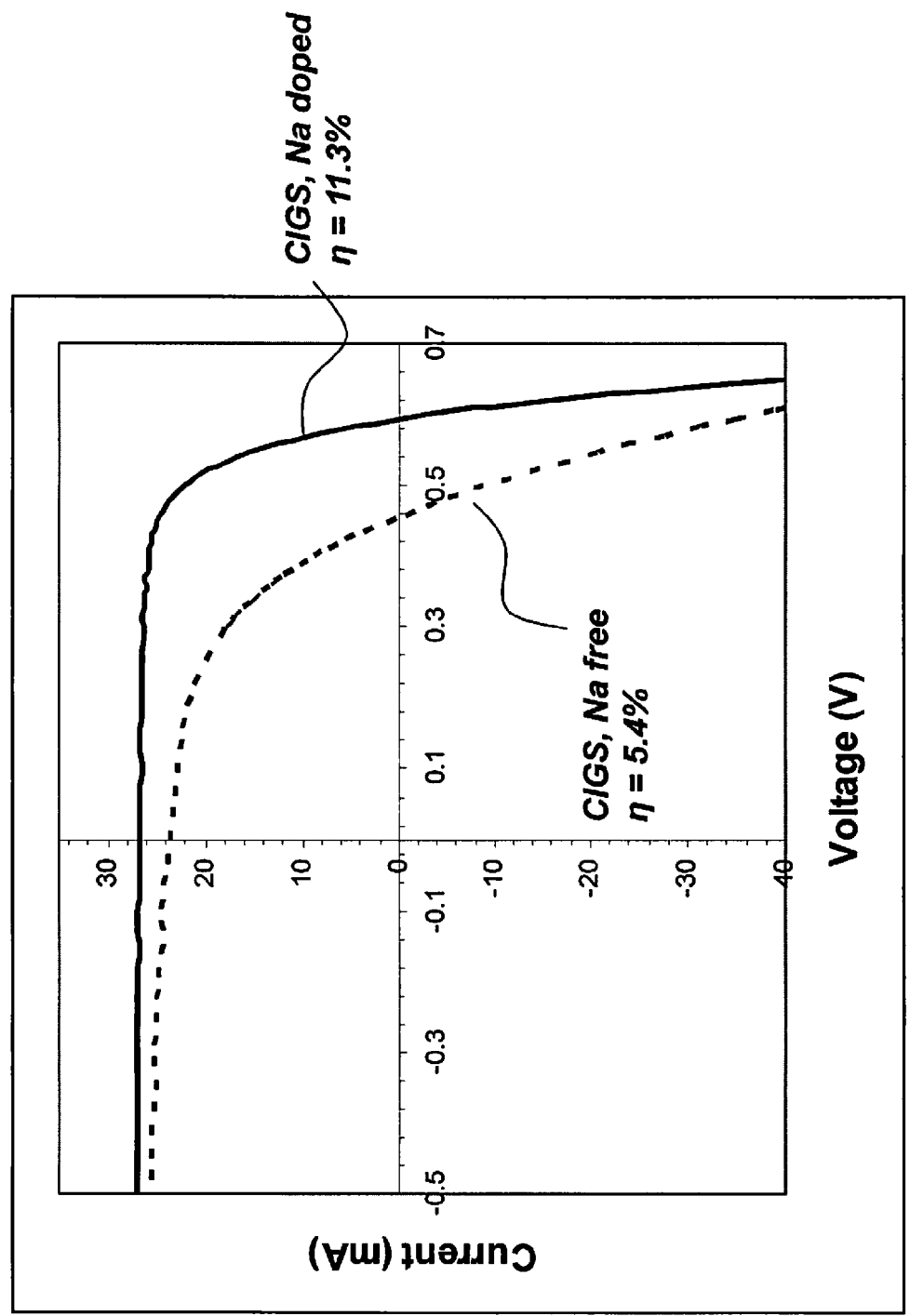
FIG. 8 shows a current-voltage plot of resulting solar cells in Example IV. The solid line refers to the I-V curve of solar cell A containing a sodium doped CIGS layer 301, while the doted line refers to the I-V curve of solar cell B containing a CIGS layer 301 substantially free of sodium. The efficiencies ($\eta$) of the solar cells are calculated as 11.3% and 5.4%, respectively.

FIG. 8 shows a current-voltage plot of solar cells A and B. Solid line refers to the I-V curve of solar cell A containing a sodium doped CIGS layer 301, while dotted line refers to the I-V curve of solar cell B containing a CIGS layer 301 substantially free of sodium. As shown in FIG. 8, solar cell A has an efficiency (η) of 11.3%, significantly higher than that of the conventional solar cell B (5.4%).

Example V

Figure 9:
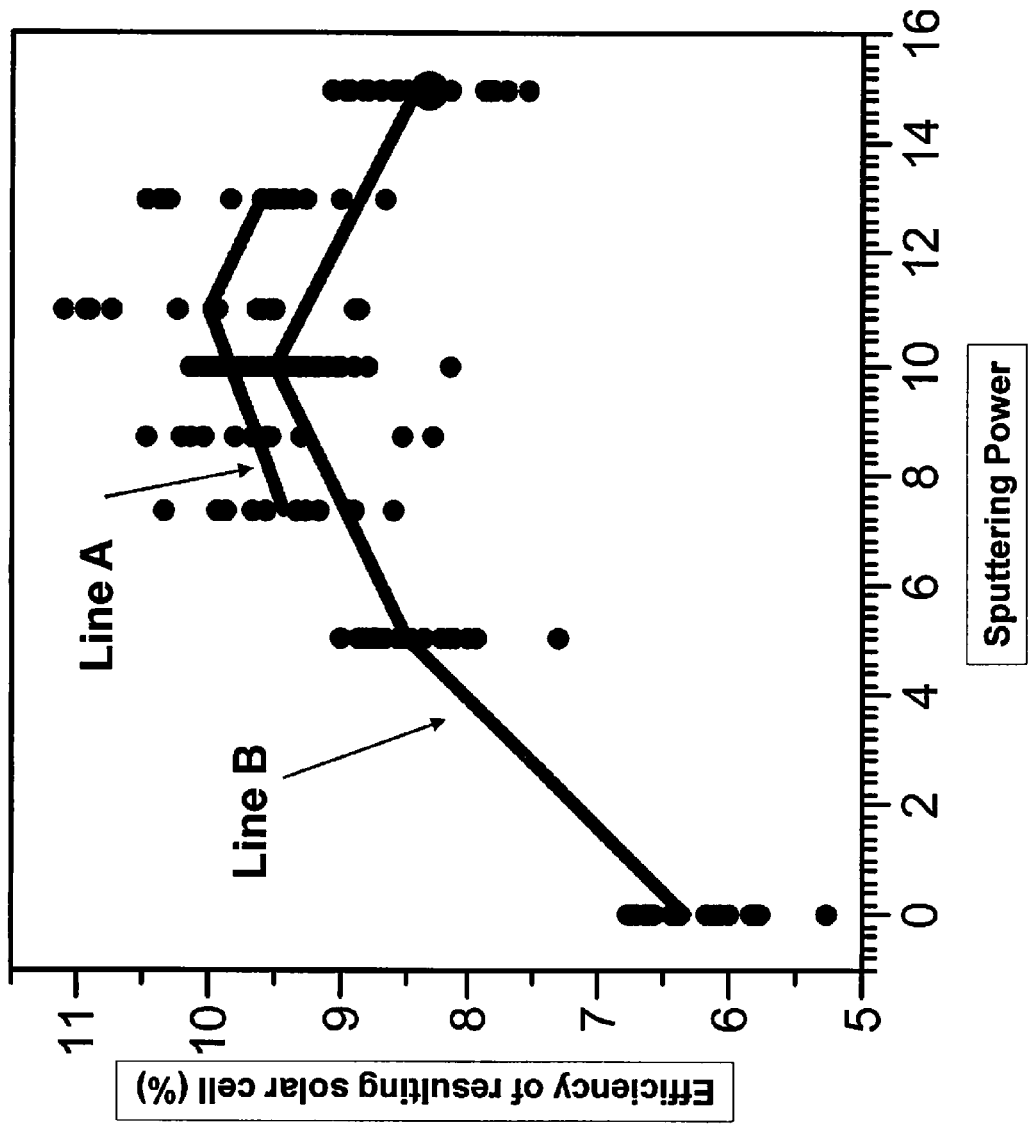
FIG. 9 shows efficiencies of solar cells in Example V. Dots refer to actual data points. Line A connects the average efficiency of solar cells comprising a first transition metal layer obtained in a first system (system A) under corresponding sputtering powers. Line B connects the average efficiency of solar cells comprising a first transition metal layer obtained in a second system (system B) under corresponding sputtering powers.

In this working example, the first transition metal layers 202 of solar cells are deposited in two sputtering systems, system A and system B, under various sputtering powers. The y-axis of FIG. 9 refers to efficiency of solar cells, while the x-axis refers to the sputtering power used. FIG. 9 shows that two different CIGS compositions (Line A and Line B) are formed over two sodium-containing molybdenum layers sputter deposited under a different sputtering power to optimize the Na content and maximize efficiency. The experiment was performed by tuning the sputtering power of the sodium-containing molybdenum targets while depositing CIGS absorber layer of composition A (in this case higher Cu content, higher selenium to metal ratios and substrate temperature independently optimized for this composition). A second CIGS absorber layer of composition B was deposited using a combination of different CIG targets, lower overall Cu content, lower selenium to metal ratios and substrate temperatures independently optimized for this composition.

Consistently, the efficiency of resulting solar cell increases initially when the sputtering power increases, and decreases after reaching an optimum sputtering power. Without wishing to be bounded to a particular theory, it is believed that an optimum sodium concentration is obtained when the optimum sputtering power is used.

The results shown in FIG. 9 also indicate that the optimum sputtering power may be sputtering system specific. Particular sputtering parameters may vary if desired.

It is to be understood that the present invention is not limited to the embodiment(s) and the example(s) described above and illustrated herein, but encompasses any and all variations falling within the scope of the appended claims. For example, as is apparent from the claims and specification, not all method steps need be performed in the exact order illustrated or claimed, but rather in any order that allows the proper formation of the solar cells of the present invention.

What is claimed is:

1. A method of manufacturing a solar cell, comprising:
  providing a substrate;
  depositing a first electrode over the substrate wherein the first electrode comprises a first transition metal layer comprising: (i) an alkali element or an alkali compound, and (ii) a lattice distortion element or a lattice distortion compound;
  depositing at least one p-type semiconductor absorber layer over the first electrode, wherein the p-type semiconductor absorber layer includes a copper indium selenide (CIS) based alloy material;
  depositing an n-type semiconductor layer over the p-type semiconductor absorber layer; and
  depositing a second electrode over the n-type semiconductor layer;
  wherein:
  the first transition metal layer comprises molybdenum;
  the alkali element or alkali compound comprises sodium;
  the lattice distortion compound or lattice distortion element is selected from the group consisting of oxygen, $MoO_2$ and $MoO_3$;
  the p-type semiconductor absorber layer comprises 0.005 to 1.5 atomic percent sodium diffused from the first transition metal layer;
  the first transition metal layer comprises at least 59 atomic percent molybdenum, 5 to 40 atomic percent oxygen and 0.01 to 1.5 atomic percent sodium;
  the second transition metal layer comprises an oxygen containing molybdenum layer that has a higher porosity than the alkali diffusion barrier layer;
  sodium diffuses from the first transition metal layer into the p-type semiconductor absorber layer through the second transition metal layer during the step of depositing the p-type semiconductor absorber layer; and
  the alkali diffusion barrier layer comprises a substantially oxygen free molybdenum layer which substantially prevents sodium diffusion from the first transition metal layer into the substrate through the alkali diffusion barrier layer.

2. The method of claim 1, wherein the steps of depositing the alkali diffusion barrier layer, depositing the first transition metal layer and depositing the second transition metal layer comprise sputtering the alkali diffusion barrier layer, sputtering the first transition metal layer and sputtering the second transition metal layer in the same sputtering apparatus.

3. The method of claim 2, wherein the step of sputtering the first transition metal layer comprises sputtering the first transition metal layer from a target comprising sodium molybdate.

4. The method of claim 2, wherein the step of sputtering the first transition metal layer comprises sputtering the first transition metal layer from at least one pair of sputtering targets having a different composition from each other.

5. The method of claim 2, wherein:
  the step of sputtering the alkali diffusion barrier layer occurs under a first sputtering environment in a first vacuum chamber of a magnetron sputtering system;
  the step of sputtering the second transition metal layer occurs under a second sputtering environment in a second vacuum chamber of the magnetron sputtering system different from the first vacuum chamber; and
  the second sputtering environment differs from the first sputtering environment in at least one of argon pressure, oxygen pressure, or nitrogen pressure.

6. The method of claim 2, wherein:
  the step of sputtering the alkali diffusion barrier layer occurs at a lower pressure than the step of sputtering the second transition metal layer such that the alkali diffusion barrier layer is in compressive stress;
  the step of sputtering the alkali diffusion barrier layer occurs in an oxygen free atmosphere; and
  the step of sputtering the second transition metal layer occurs in an oxygen containing atmosphere.

* * * * *